United States Patent [19]

Sangyoji et al.

[11] Patent Number: 4,935,767
[45] Date of Patent: Jun. 19, 1990

[54] COLOR-IMAGE COPYING APPARATUS
[75] Inventors: Kazuo Sangyoji, Nagoya; Kenji Sakakibara, Ichinomiya, both of Japan
[73] Assignee: Brother Kogyo Kabushiki Kaisha, Tokyo, Japan
[21] Appl. No.: 256,853
[22] Filed: Oct. 12, 1988
[30] Foreign Application Priority Data Oct. 12, 1987 [JP] Japan .................................. 62-256825

[51] Int. Cl.$^5$ ............................................. G03B 27/72
[52] U.S. Cl. ......................................... 355/20; 355/38; 355/27; 355/67
[58] Field of Search .................................. 355/27–29, 355/20, 67, 71; 346/110 R; 358/60, 231; 350/339 F

[56] References Cited
U.S. PATENT DOCUMENTS 4,631,594 12/1986 Imabayashi et al. ................ 358/231
4,734,761 3/1988 Kondoh et al. ................. 346/110 R
4,799,085 1/1989 Nagumo et al. ...................... 355/27

Primary Examiner—L. T. Hix
Assistant Examiner—D. Rutledge
Attorney, Agent, or Firm—Kane, Dalsimer, Sullivan, Kurucz, Levy, Eisele and Richard

[57] ABSTRACT

In a color-image copying apparatus, a light source emits light to shine upon an original. An optical system utilizes the light with which the original is illuminated, for copying color image information on the original, onto a recording medium. The light source includes an electron gun emitting an electron beam, a controller for controlling intensity of the electron beam emitted by the electron gun, a deflector for deflecting the electron beam emitted by the electron gun, and a fluorescent portion irradiated with the electron beam deflected by the deflector, for emitting a plurality of fluorescence-luminescing colors.

7 Claims, 2 Drawing Sheets

COLOR-IMAGE COPYING APPARATUS

BACKGROUND OF THE INVENTION

This invention relates to a color-image copying apparatus in which color image information on an original is illuminated with light from a light source, and is copied onto a recording medium on the basis of faithful hues.

In a conventional color-image copying apparatus, intensive light is emitted from a light source to illuminate an original, and reflecting light or transmitting light of the emitted light is utilized to faithfully copy color image information on an original, onto a recording medium. It is required for the light source to have a large quantity of light obtained easily, to be turned on instantaneously at the copying operation, and to have the cost reduced. A halogen lamp or the like (hereinafter referred to simply as "conventional light source") has conventionally been employed as the light source.

However, the conventional light source is low in luminescent efficiency so that a major part of the energy inputted is emitted as heat waves. By this reason, considerable heat is generated in order to obtain a light quantity sufficient for illumination of the original. This results in such problems as an increase in size of the equipment and an increase in the cost because of the measures to counter the heat such as heat radiation and the like.

Further, for copying the color image information by the use of the conventional light source, three kinds of monochromatic light sources such as, for example, three kinds of laser light sources are required to obtain three primary colors including red R, green G and blue B, and color filters are additionally required to adjust a ratio in light quantity among the three primary colors. This raises such problems as an increase in the number of component parts, complication of the optical system, an increase in the cost attendant thereon, and so on.

SUMMARY OF THE INVENTION

It is therefore an object of this invention to provide an improved color-image copying apparatus which has it construction simplified in an optical system, reduced in size and reduced in the cost, and which is capable of copying faithfully color image information on an original having a plurality of hues.

For the above purpose, according to the invention, there is provided a color-image copying apparatus comprising:

a light source for emitting light to shine upon an original; and an optical system utilizing the light with which the original is illuminated, for copying color image information on the original, onto a recording medium, the light source including:

an electron gun emitting an electron beam;

control means for controlling intensity of the electron beam emitted by the electron gun;

deflecting means for deflecting the electron beam emitted by the electron gun; and a fluorescent portion irradiated with the electron beam deflected by the deflecting means, for emitting a plurality of fluorescence-luminescing colors.

The color-image copying apparatus according to the invention utilizes the plurality of colors fluorescence-luminescing at the fluorescent portion when the same is irradiated with the electron beam emitted from the electron gun serving as the light source shining upon the original. The plurality of fluorescence-luminescing colors are controllable by the intensity of the electron beam directed toward the fluorescent portion and by the position on the fluorescent portion to which the electron beam is directed. In order to realize such control, there are arranged the control means for controlling the intensity of the electron beam and the deflecting means for deflecting the electron beam.

In connection with the above, the hues of the colors fluorescence-luminescing at the fluorescent portion are determined by fluorescent materials. The hues may be combined with each other in any desirable manner. That is, the fluorescence-luminescing colors may include simple two fluorescence-luminescing colors, or may include fluorescence-luminescing colors of the three primary colors enabling full color copying. Further, in order to prevent adjustments of intensities of the respective fluorescence-luminescing colors from interfering with each other so that the respective intensities can be well controlled, such a technique may be employed that a guard for shielding the electron beam is provided at an interface between each pair of adjacent fluorescent materials which are different in fluorescence-luminescing hues.

BRIEF DESCRIPTION OF THE ACCOMPANYING DRAWINGS

DESCRIPTION OF THE EMBODIMENTS

Figure 1:
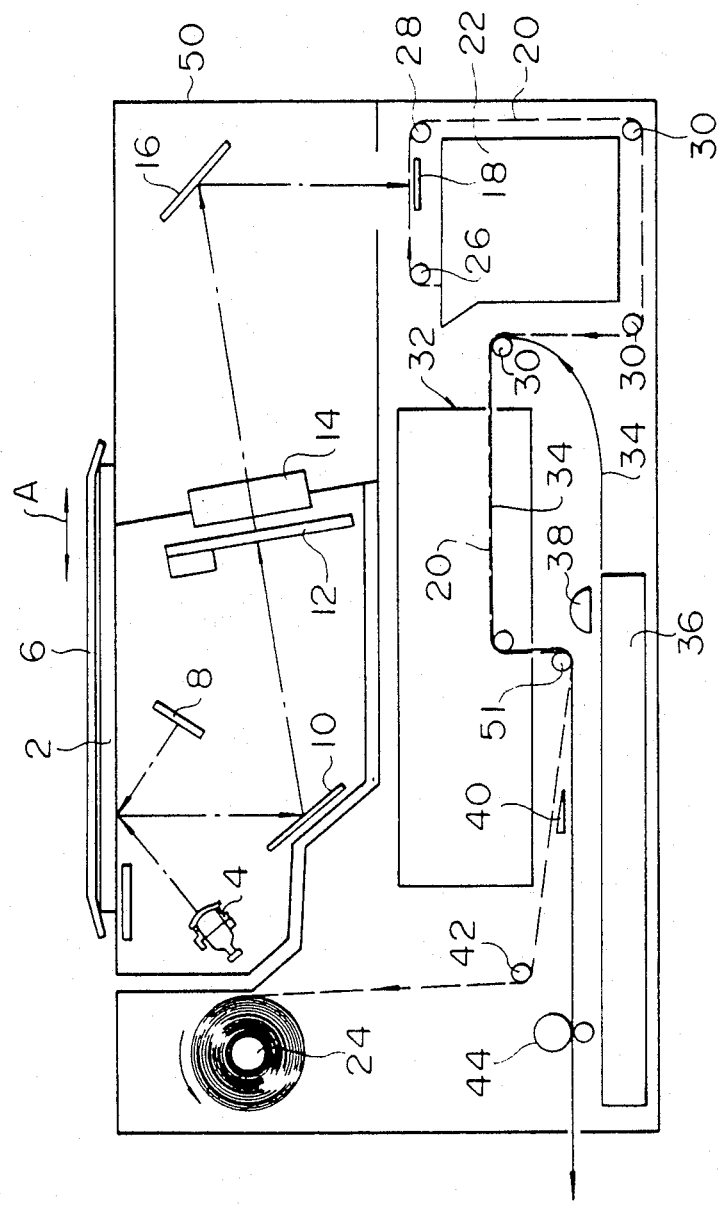
FIG. 1 is a schematic cross-sectional view of a photo and pressure sensitive copying apparatus embodying the invention.

Referring to FIG. 1, there is schematically shown in cross-section a photo and pressure sensitive copying apparatus enabling full color copying. A photosensitive recording medium enabling such copying is composed of a continuous web and a developing sheet. The continuous web is coated with microcapsules each containing dye precursor, while the developing sheet is coated with developer. Such recording medium has been proposed in Japanese Patent Application Laid-Open No. 58-23025, and is not described here in detail.

As shown in FIG. 1, the apparatus comprises a body 50. A transparent glass platen 2 is mounted to the top of the body 50 for reciprocative sliding movement in a direction indicated by an arrow A in FIG. 1. An any desirable original can be set on the platen 2 in such a manner that a side of the original having carried thereon color image information faces downwardly. A light source 4 for emitting light in the form of a line extending perpendicularly to the drawing sheet is fixedly arranged at a left upper location within the body 50. The light source 4 has a light-emitting surface which is directed toward the platen 2. When the platen 2 slides, the light from the light source 4 shines successively upon consecutive surface sections of the platen 2 so that the entire surface of the platen 2 extending from the left-hand end to the right-hand end thereof as viewed in FIG. 1 can be illuminated with the light. The light emitted from the light source 4 is transmitted through the platen 2 and is reflected by the original placed on the platen 2. A platen cover 6 is provided which covers an upper surface of the platen 2 to prevent the emitted light from leaking through areas of the platen 2 except for an area thereof on which the original is placed. A reflector 8 is arranged on the right of the light source 4 in order that the light emitted from the light source 4 is utilized at high efficiency for shining upon the original. That is, the reflector 8 reflects a part of the light which is not directly directed toward the original, to utilize the reflected light part to shine upon the original.

The light emitted from the light source 4 and reflected from a predetermined line on the original which is determined by the sliding position of the platen 2, is reflected by a reflecting mirror 10 arranged just below the predetermined line, toward a right upper location within the body 50. The light reflected by the reflecting mirror 10 is caused to pass through a shutter 12 for intercepting an unnecessary reflected light part, and through a focusing lens system 14. The light having passed through the lens system 14 is changed in optical path downwardly by a reflecting mirror 16. The light reflected by the original in the manner described above advances straight along the right-hand side wall of the body 50, and is focused on a table 18.

On the other hand, the continuous web 20 is wound into a roll which is accommodated in a cartridge or Patrone 22 which is arranged below the table 18. One end portion of the web 20 extends through a plurality of feed rollers and a pressure developing unit subsequently to be described, and reaches a take-up shaft 24. Specifically, the web 20 coming out of an upper end of the cartridge 22 passes along an upper surface of the table 18, while being guided by feed rollers 26 and 28. The web 20 is transported around the cartridge 22 by another feed rollers 30, and is delivered to an inlet of a pressure developing unit 32 which is arranged on the left of the cartridge 22. In this connection, transporting speed of the web 20 is beforehand brought into coincidence with the sliding speed of the platen 2. Accordingly, latent image portions corresponding respectively to the consecutive sections of the original, which pass successively across the predetermined line, are formed successively onto consecutive sections of the web 20 passing across the table 18. Thus, a latent image corresponding to the color image information on the original is formed onto a portion of the web 20.

Below the pressure developing unit 32, a sheet cartridge 36 is arranged which accommodates therein a stack of developing sheets 34 of cut sheet type. Above the sheet cartridge 36, a roller 38 is arranged for drawing the developing sheets 34 one by one out of the sheet cartridge 36. The drawn developing sheet 34 is transported toward the inlet of the pressure developing unit 32. The developing sheet 34 is brought into close contact with the portion of the web 20 having carried thereon the latent image. That is, the developing sheet 34 and the web 20 are superimposed one upon the other and are transported toward the inlet of the pressure developing unit 32 where the latent image on the portion of the web 20 is developed onto the developing sheet 34.

The superimposed web and sheet 20 and 34 completed in the developing processing are transported downwardly out of the pressure developing unit 32, and are changed in direction to the left by a guide roller 51. The web and sheet 20 and 34 are then separated from each other by a separator 40 arranged on the left of the guide roller 51. The web 20 is transported upwardly by a guide roller 42, so that the used portion of the web 20 is wound around the take-up roller 24. On the other hand, the separated developing sheet 34 is transported to a heat-fixing unit 44. The developing sheet 34 having passed through the heat-fixing unit 44 is discharged out of the body 50.

Figure 2:
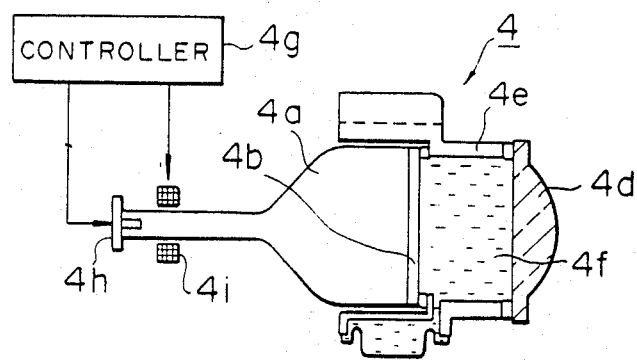
FIG. 2 is an enlarged cross-sectional view of a light source employed in the apparatus illustrated in FIG. 1.
Figure 3:
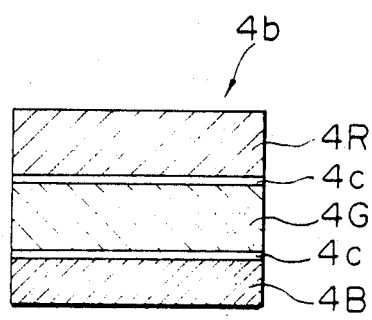
FIG. 3, is an enlarged fragmentary schematic view of a screen of the light source illustrated in FIG. 2.

The light source 4 employed in the apparatus constructed as above will be described in detail with reference to FIGS. 2 and 3. FIG. 2 is an enlarged cross-sectional view of the light source 4. As shown in the figure, the light source 4 comprises its main component that is a high-luminance cathode-ray tube (hereinafter referred to as "high-luminance CRT") 4a. The high-luminance CRT 4a has a screen 4b which is coated, in a striped fashion, with three kinds of fluorescent materials 4R, 4G and 4B emitting their respectively fluorescent colors of red (R), green (G) and blue (B), as shown in FIG. 3. The fluorescent materials 4R, 4G and 4B are partitioned by guards 4c and are prevented by the same from interfering with each other. A convex cylindrical lens 4d is arranged in front of the screen 4b and is mounted thereto by a coupler 4e, in order to bring the fluorescence-luminescing light into the form of a line as mentioned previously for use in illumination of the original. Cooling liquid 4f serving as a liquid lens and as cooling of the screen 4b is sealingly contained within the coupler 4e. The coupler 4e has a large surface area and serves also as a heat radiator. The high-luminance CRT 4a includes a controller 4g which has its control ability similar to that of a Braun tube of a usual television. The controller 4g is so designed as to control input voltage applied to an electron gun 4h mounted to an end of a neck portion, to adjust intensity of an electron beam emitted. The controller 4g also controls exciting current flowing through a deflecting coil 4i wound about the neck portion, to adjust the position on the screen 4b to which the electron beam is directed. That is, the controller 4g can freely control the intensity of the light fluorescence-luminescing from the screen 4b, and the fluorescence-luminescing hues. More specifically, the controller 4g is connected to the deflecting coil 4i to control the exciting current flowing therethrough in such a manner that the fluorescent material 4R is first irradiated with the electron beam to cause the red monochromatic light to fluorescence-luminesce at the screen 4b, the fluorescent material 4G is then irradiated with the electron beam to cause the the green monochromatic light to fluorescence-luminesce at the screen 4b and, subsequently, the fluorescent material 4B is irradiated with the electron beam to cause the blue monochromatic light to fluorescence-luminesce at the screen 4b.

It will be apparent that the color-image copying apparatus constructed as above according to the embodiment has the following advantages.

First, the apparatus according to the embodiment comprises the light source 4 shining upon the original, which utilizes the high-luminance CRT 4a. As is well known, the high-luminance CRT 4a can easily obtain a large light quantity, is turned on instantaneously, and is low in cost. That is, the high-luminance CRT 4a satisfies all the performances required as a light source for the apparatus. Secondly, since the high-luminance CRT 4a fluorescence-luminesces at high efficiency, no useless heat is generated so that sufficient heat measures can be taken by the aforesaid simple arrangement. Accordingly, mechanisms relating to heat radiation can all be dispensed with, making it possible to reduce the size of the apparatus and to reduce the cost thereof. Thirdly, only execution of the adjustment by means of the controller 4g enables the intensity and the hues of the light shining upon the original to be controlled freely, so that a color filter and the like which are required for the conventional apparatus, can be dispensed with, making it possible to achieve simplification of the optical system. Moreover, any other suitable recording media for use in copying, which are different in spectral sensitivity from the continuous web 20, can be utilized without any difficulty. That is, when the recording medium different in spectral sensitivity is employed, it is possible to copy with the recording medium, only by adjusting the controller 4g depending upon the spectral sensitivity to alter the intensity of the electron beam. Thus, the applicability of the copying apparatus can be enhanced.

Furthermore, in the above-described embodiment, the cylindrical lens 4d, the cooling liquid 4f and the coupler 4e serve as the lens function converging the light emitted from the high-luminous CRT 4a into the form of a line and also as heat radiation function for the screen 4d. Accordingly, it is possible to achieve further reduction in size and cost. Moreover, the fluorescent materials coated on the screen 4b cover the three primary colors (R, G, B) and are partitioned by the guards 4c which prevent the fluorescent materials from interfering with each other. Thus, it is possible to fulfill the function of full color copying which is clear extremely.

Although the above embodiment has been described in which the invention is applied to the copying apparatus of photo and pressure sensitive type, the invention is not limited to such apparatus. The invention is applicable also to various types of copying apparatuses of thermal transfer type and the like, without departure from the spirit of the invention.

As described above in detail with reference to the embodiment, the color-image copying apparatus according to the invention is so arranged that the cathode-ray tube is utilized as the light source for emitting the light with which the original is illuminated. Accordingly, the intensity, the hues and the like of the light can easily be controlled and, in addition thereto, useless heat generation can be avoided. Thus, the color filter and the measure to counter the heat, which are conventionally necessary, can be dispensed with. Thus, there is provided a superior color-image copying apparatus whose construction is small in size and low in cost and which can faithfully copy the color image information on the original having a plurality of hues.

What is claimed is:
1. A color-image copying apparatus comprising:
a light source for emitting light to shine upon an original; and
an optical system utilizing the light with which the original is illuminated, for copying color image information on said original, onto a recording medium,
said light source including:
an electron gun emitting an electron beam;
control means for controlling intensity of the electron beam emitted by said electron gun;
deflecting means for deflecting the electron beam emitted by said electron gun; and
a fluorescent portion irradiated with the electron beam deflected by said deflecting means, for emitting a plurality of fluorescence-luminescing colors.
2. The color-image copying apparatus according to claim 1, wherein said fluorescent portion includes three kinds of fluorescent materials for emitting respective fluorescent colors of red, green and blue, and wherein said control means is connected to said deflecting means to control the same in such a manner that one of said three kinds of fluorescent materials is first irradiated with the electron beam to cause a first monochromatic light to fluorescence-luminesce at said screen, another fluorescent material is then irradiated with the electron beam to cause a second monochromatic light to fluorescence-luminesce at said screen and, subsequently, the other fluorescent material is irradiated with the electron beam to cause a third monochromatic light to fluorescence-luminesce at said screen.
3. The color-image copying apparatus according to claim 1, wherein said light source comprises a high-luminance cathode-ray tube.
4. The color-image copying apparatus according to claim 3, wherein said high-luminance cathode-ray tube includes a screen to which said electron beam emitted by said electron gun is directed, a cylindrical lens arranged in front of said screen, a coupler for mounting said cylindrical lens to said screen, and a liquid lens contained within said coupler and arranged between said screen and said cylindrical lens.
5. The color-image copying apparatus according to claim 4, wherein said fluorescent portion includes three kinds of fluorescent materials coated on said screen for emitting respective fluorescent colors of red, green and blue, and wherein said fluorescent materials are partitioned by guards and are prevented by the same from interfering with each other.
6. The color-image copying apparatus according to claim 5, wherein said control means is connected to said deflecting means to control the same in such a manner that one of said three kinds of fluorescent materials is first irradiated with the electron beam to cause a first monochromatic light to fluorescence-luminesce at said screen, another fluorescent material is then irradiated with the electron beam to cause a second monochromatic light to fluorescence-luminesce at said screen and, subsequently, the other fluorescent material is irradiated with the electron beam to cause a third monochromatic light to fluorescence-luminesce at said screen.
7. The color-image copying apparatus according to claim 1, wherein the recording medium includes a continuous web coated with microcapsules each containing dye precursor.

* * * * *